| (12) | United States Patent | (10) Patent No.: | US 8,811,086 B2 |
|---|---|---|---|
| | Kim | (45) Date of Patent: | Aug. 19, 2014 |

(54) FLASH MEMORY DEVICE AND PROGRAMMING METHOD THEREOF

(75) Inventor: Moo-Sung Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 721 days.

(21) Appl. No.: 12/458,089

(22) Filed: Jun. 30, 2009

(65) Prior Publication Data

US 2010/0002519 A1  Jan. 7, 2010

(30) Foreign Application Priority Data

Jul. 7, 2008 (KR) .................. 10-2008-0065687

(51) Int. Cl.
  *G11C 16/04* (2006.01)
  *G11C 16/06* (2006.01)
  *G11C 16/08* (2006.01)
  *G11C 16/10* (2006.01)
  *G11C 16/12* (2006.01)

(52) U.S. Cl.
  USPC ............. 365/185.18; 365/185.17; 365/185.23

(58) Field of Classification Search
  USPC ...................... 365/185.17, 185.18, 185.23
  See application file for complete search history.

(56) References Cited

U.S. PATENT DOCUMENTS

| 5,621,684 | A | 4/1997 | Jung |
| 6,134,140 | A * | 10/2000 | Tanaka et al. ............ 365/185.03 |
| 7,355,887 | B2 | 4/2008 | Nakamura et al. |
| 2005/0237829 | A1 | 10/2005 | Nakamura et al. |
| 2007/0277027 | A1 * | 11/2007 | Kim et al. ......................... 713/1 |

FOREIGN PATENT DOCUMENTS

| JP | 08-279297 | 10/1996 |
| JP | 2005-327436 | 11/2005 |
| KR | 10-0145475 | 4/1998 |
| KR | 10-0763093 | 9/2007 |

* cited by examiner

*Primary Examiner* — J. H. Hur
(74) *Attorney, Agent, or Firm* — Harness, Dickey & Pierce

(57) ABSTRACT

A flash memory device including a controller to determine higher, M, and lower, N, word-line address bits based on an input word-line address, to determine a selected area of a memory array based on the higher and lower word-line address bits, and an unselected area of the memory array based on the selected area; and a high voltage generator to provide a first pass voltage to a word line of the selected area, and to provide a second pass voltage to a word line of the unselected area. The pass voltages are discriminately applied to the programmed and non-programmed memory cells, enlarging the pass voltage window. The memory array is divided into pluralities of zones to which local voltages are each applied in different levels.

18 Claims, 12 Drawing Sheets

FLASH MEMORY DEVICE AND PROGRAMMING METHOD THEREOF

PRIORITY STATEMENT

This U.S. non-provisional patent application claims priority under 35 U.S.C. §119 to Korean Patent Application No. 10-2008-65687 filed on Jul. 7, 2008, in the Korean Intellectual Property Office (KIPO), the entire contents of which is incorporated herein by reference.

BACKGROUND

1. Field

Example embodiments relate to flash memories. More particularly, the example embodiments are concerned with a flash memory device capable of providing a pass voltage with various levels and a programming method thereof.

2. Description of the Related Art

In recent years, flash memory devices have been interested in the necessity of assuring pass voltage windows along the shrinking-down of design rule.

In a programming operation of a flash memory device, a program voltage is applied to a selected word line while a pass voltage is applied to unselected word lines.

Program voltage disturbance caused by a low pass voltage results in a malfunction that program-inhibited memory cells, among pluralities of memory cells, coupled to a word line to which the program voltage is applied fail during programming. Pass voltage disturbances, caused by a high pass voltage, result in a malfunction of memory cells to which the pass voltage is applied. Pluralities of memory cells coupled to the same cell string, fail during programming.

In other words, the pass voltage window means a proper range of the pass voltage without the pass voltage disturbances and the program voltage disturbances. Therefore, a broad pass voltage window enhances the reliability of the flash memory device.

However, in practice a pass voltage window is only determined after fabricating a wafer including flash memory devices. An insufficient pass voltage window generates a need to modify a programming method several times by way of revision, which delays a development term or turnaround time of the flash memory devices.

SUMMARY

Example embodiments are directed to solve the aforementioned problem, providing a flash memory device capable of applying a pass voltage in various levels and the programming method thereof.

An example embodiments is a flash memory device including a controller configured to determine higher and lower word-line address bits based on an input word-line address, to determine a selected area of a memory array based on the higher and lower word-line address bits, and to determine an unselected area of the memory array based on the selected area; and a high voltage generator configured to provide a first pass voltage to a word line of the selected area, and configured to provide a second pass voltage to a word line of the unselected area.

In an example embodiment, word-line addresses of the memory array are divided into a plurality of zones.

In an example embodiment, word-line addresses of the selected area are divided into a plurality of zones.

In an example embodiment, the memory array is divided into a plurality of zones, a set of pass voltages is associated with each zone of the plurality of zones, the set of pass voltages include at least one voltage and the set of pass voltages associated with each zone are different, and the high voltage generator selects, the first pass voltage from the set of voltages associated with the zone corresponding to the selected area, and the second pass voltage from the set of voltages associated with the zone corresponding to the unselected area.

In an example embodiment, the high voltage generator selects the first pass voltage based on the word-line address.

In an example embodiment, the higher and lower word-line address bits differ by the input word-line address.

In an example embodiment, the input word-line address is supplied by a program voltage.

In an example embodiment, information about the M and N is stored in one of an electric fuse and a nonvolatile memory.

In an example embodiment, the memory array is a nonvolatile memory and includes at least one of a NAND flash memory, a NOR flash memory, phase-change random access memory, and a magnetic random access memory.

In an example embodiment, the M and the N are natural numbers and smaller than the total number of word lines in the memory array.

Another example embodiment is a programming method of a flash memory, including setting two constants M and N; inputting word-line address information to be programmed; determining the word-line address information to be programmed, determining higher, M, and lower, N, word-line address bits based on the word line address information, determining a selected area of the flash memory based on the higher and lower word-line addresses, and determining an unselected area of the memory array based on the selected area; applying a first pass voltage to an address of the selected area; and applying a second pass voltage to an address of the unselected area.

In an example embodiment, the input word-line address is supplied by a program voltage.

In an example embodiment, word-line addresses of the flash memory are divided into a plurality of zones.

In an example embodiment, the memory array is divided into a plurality of zones, a set of pass voltages is associated with each zone of the plurality of zones, the set of pass voltages include at least one voltage and the set of pass voltages associated with each zone are different, and the high voltage generator selects, the first pass voltage from the set of voltages associated with the zone corresponding to the selected area, and the second pass voltage from the set of voltages associated with the zone corresponding to the unselected area.

In an example embodiment, the selected area includes the constants M and N which differ by the input word-line address.

In an example embodiment, the constants M and N are natural numbers and smaller than a total number of word lines in the memory array.

A further understanding of the nature and advantages of the present invention herein may be realized by reference to the remaining portions of the specification and the attached drawings.

BRIEF DESCRIPTION OF THE DRAWINGS

Example embodiments will be more clearly understood from the following brief description taken in conjunction with the accompanying drawings.

FIG. 1 is a block diagram of a flash memory device according to an example embodiment.

FIG. 2 is a block diagram schematically illustrating the SI controller shown in FIG. 1.

FIG. 3 is a circuit diagram illustrating the selective SI controller shown in FIG. 2.

FIG. 4 is a circuit diagram illustrating the deselective SI controller shown in FIG. 2.

FIG. 5 is a circuit diagram illustrating the SI driver shown in FIG. 2;

FIG. 6 is a graphic diagram showing an example embodiment.

FIG. 7 is a graphic diagram depicting pass voltages according to the first zone shown in FIG. 6.

FIG. 8 is a graphic diagram depicting pass voltages according to the third zone shown in FIG. 6.

FIG. 9 is a graphic diagram showing an example embodiment.

FIG. 10 is a flow chart showing a programming method for the flash memory device according to the example embodiment.

FIG. 11 is a block diagram of a computing system including a memory system according to the example embodiment.

FIG. 12 is a block diagram of a memory-based storage unit according to an example embodiment.

Figure 1:
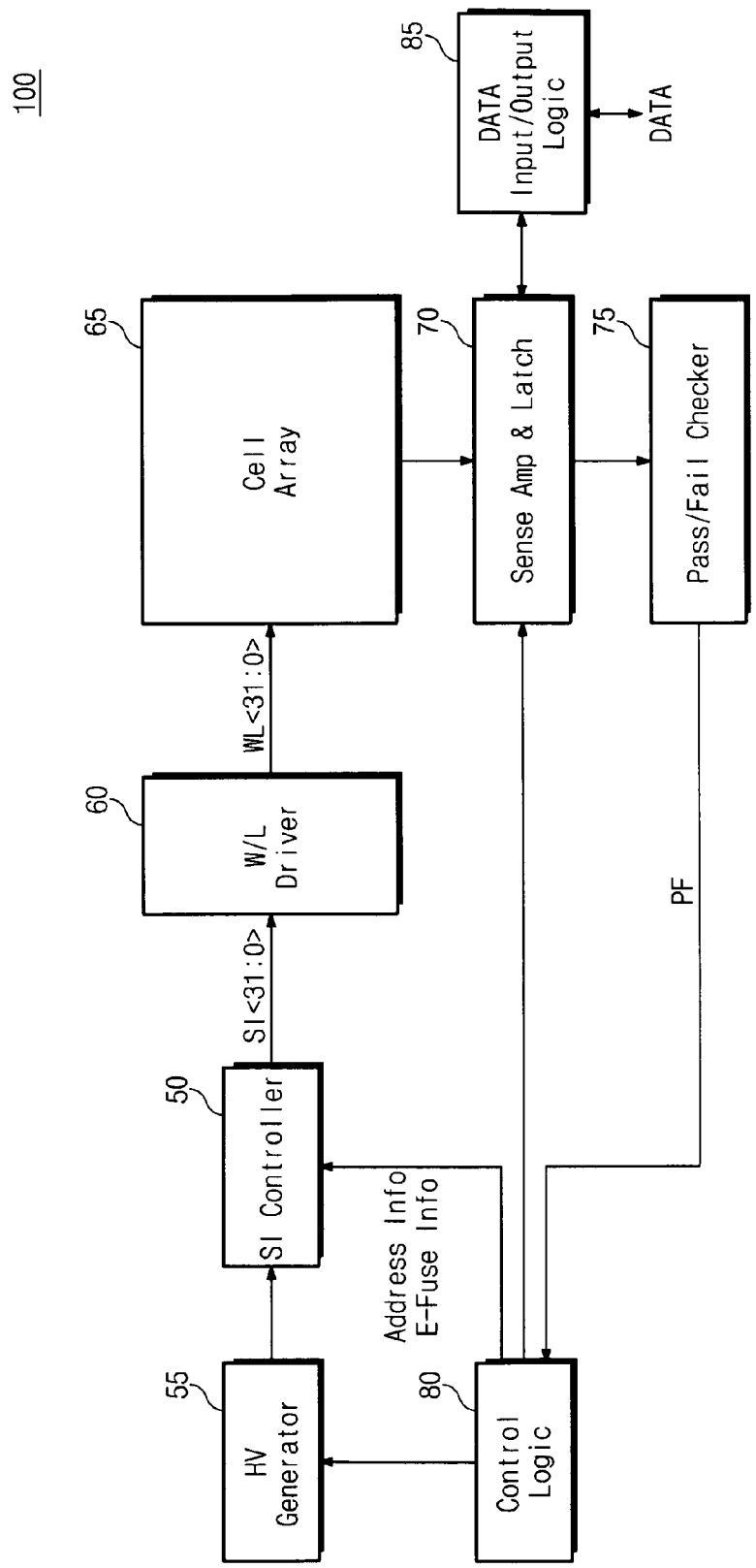
FIGS. 1-12 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will be described below in more detail with reference to the accompanying drawings. Example embodiment may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In memory cells to which a program voltage is coupled, when the same pass voltage is applied to previously programmed memory cells (programmed memory cells) and non-programmed memory cells, the programmed and non-programmed memory cells may be changed to have different threshold voltages from each other. For example, if the same pass voltage is applied to the programmed and non-programmed memory cells, a pass voltage window may be reduced.

Therefore, example embodiments offer advanced means for discriminately applying pass voltages to the programmed and non-programmed memory cells, enlarging the pass voltage window. In addition, according to example embodiments, the total word-line address is divided into pluralities of zones. To the plural zones, local voltages are applied at different voltage levels.

For example, on a word line to which the program voltage is applied, one of the pass voltages different voltages may be applied to memory cells connected to the higher M-numbered and lower N-numbered word lines, maximizing a width of the pass voltage window.

The pass voltage applied to an unselected area does not affect the pass voltage window. The pass voltage applied to the selective zone determines the pass voltage window.

FIG. 1 is a block diagram of a nonvolatile memory device according to an example embodiment. Referring to FIG. 1, the nonvolatile memory device 100 according to the example embodiment is a flash memory device. The nonvolatile memory device 100 according to the example embodiment includes a SI controller 50, a word line driver (W/L driver) 60, a high voltage generator (HV generator) 55, a memory cell array 65, a sense amplifier & latch circuit 70, a pass/fail checker 75, a control logic circuit 80, and a data input/output circuit 85.

The nonvolatile memory device (e.g., flash memory device) 100 includes the memory cell array 65 having memory cells arranged in a matrix of rows (or word lines) and columns (or bit lines).

Each of the memory cells arranged in the memory cell array 65 stores 1-bit data. On the other side, each memory cell is able to store n-bit data (n=2 or an integer larger than 2). The word line driver 60 selects one of the word lines in response to a word line address, and couples one of plural high voltages, which are supplied from the high voltage generator 55, with the selected word line in response to the SI controller 50.

The sense amplifier & latch circuit 70 operates by the control logic circuit 80, reading data from the memory cell array 65 in a reading/verifying operation.

In the reading operation, data is output by way of the data input/output circuit 85. In the verifying operation, data is output through the pass/fail checker 75. The sense amplifier & latch circuit 70 receives data, which is to be written into the memory cell array 65 in the programming operation, through the data input/output circuit 85, and drives the bit lines by a program voltage (e.g., a level of the ground voltage) or a program-inhibition voltage (e.g., a level of the power source voltage) in correspondence with the received data.

The pass/fail checker 75 determines whether data values output from the sense amplifier & latch circuit 70 during the program/erasure-verifying operation are same (e.g., pass data value). From the determination, the pass/fail checker 75 outputs a pass/fail signal PF to the control logic circuit 80. The word line driver 60 controls the word lines of the memory device 100. The high voltage generator 55 operates to generate pluralities of voltages higher than the power source voltage VDD. The SI controller 50 receives address and electric fuse (E-FUSE) information from the control logic circuit 80, and outputs a signal SI<31:0> to the word line driver 60.

Figure 2:
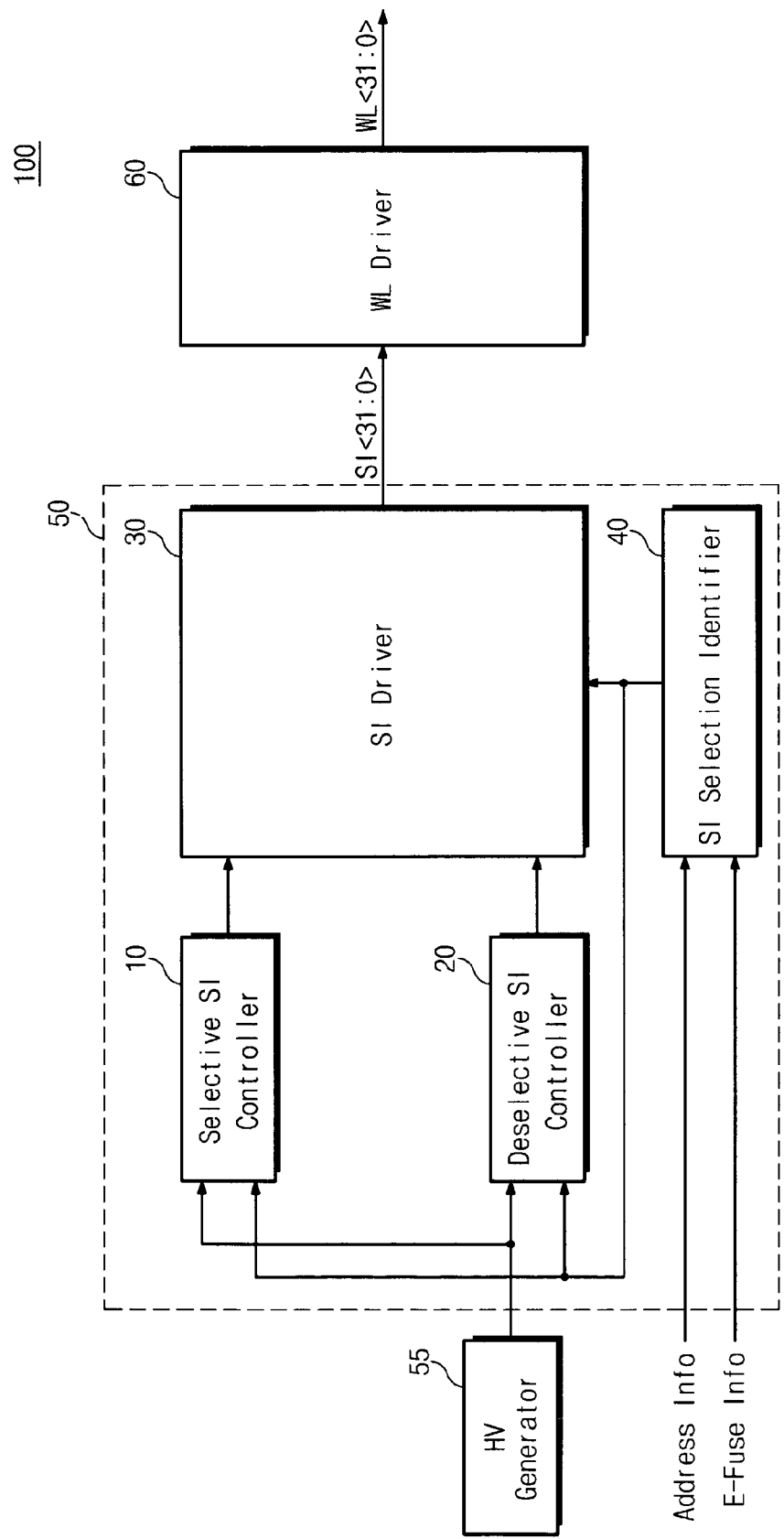

FIG. 2 is a block diagram schematically illustrating the SI controller 50 shown in FIG. 1.

Referring to FIGS. 1 and 2, the SI controller 50 according to an example embodiment provides the word line driver 60, which controls the word lines of the flash memory device, with one of the plural high voltages generated from the high voltage generator 55. The SI controller 50 includes a selective SI controller 10, a deselective SI controller 20, an SI driver 30, and an SI selection identifier 40.

The selective SI controller 10 provides the SI driver 30 with one of the plural high voltages in response to an enabling signal from the SI selection identifier 40. The structure of the selective SI controller 10 will be detailed below in FIG. 3.

The deselective SI controller 20 provides the SI driver 30 with one of the plural high voltages in response to an enabling signal from the SI selection identifier 40. The structure of the deselective SI controller 10 will be detailed below in conjunction with FIG. 4.

The SI selection identifier 40 determines whether a current address corresponds to a selected or unselected area with reference to address and E-FUSE information. A selected area is assigned to the higher M-numbered and lower N-numbered address bits on an input address. An unselected area is assigned to the rest of the selected area address. The E-FUSE information contains information about M and N. Further, the E-FUSE according to an example embodiment may be replaced by a nonvolatile memory, e.g., flash memory.

The SI driver 30 provides the word line driver 60 with one of outputs from the selective or deselective SI controller 10 or 20 in accordance with a result of the determination by the SI selection identifier 40. The structure of the SI driver 30 will be detailed below in FIG. 5.

Figure 3:
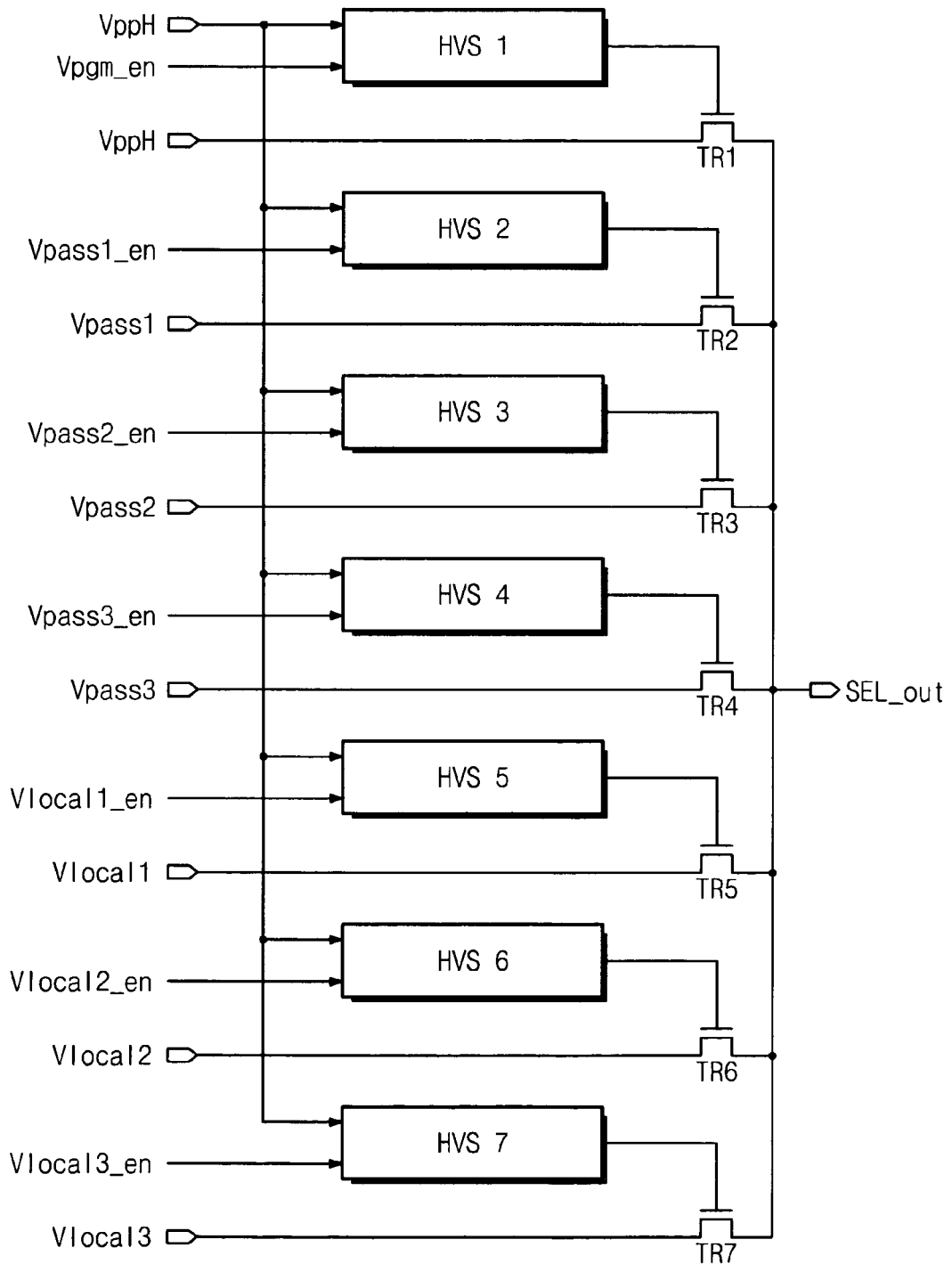

FIG. 3 is a circuit diagram illustrating the selective SI controller 10 shown in FIG. 2.

Referring to FIG. 3, the example embodiment will be described by assuming that the total number of address bits for the word lines is 32. While FIG. 3 just shows one selective SI controller 10, the word line driver 60 needs to have 32 selective SI controllers 10 in order to supply the 32-bit address.

The selective SI controller 10 according to the example embodiment includes first through seventh high-voltage switches HVS1~HVS7 and first through seventh NMOS transistors TR1~TR7. Drain nodes of the first through seventh NMOS transistors TR1~TR7 are commonly connected to an output terminal of the selective SI controller 10 from which a selection signal SEL_out is output.

The first high-voltage switch HVS1 may receive a high voltage VppH and a program-voltage enabling signal Vpgm_en, and may be connected to a gate node of the first NMOS transistor TR1. The first NMOS transistor TR1 may be connected between the program voltage Vpgrn and the output terminal of the selective SI controller 10, and may be controlled by the first high-voltage switch HVS1.

The second high-voltage switch HVS2 may receive the high voltage VppH and a first pass-voltage enabling signal Vpass1_en, and may be connected to a gate node of the second NMOS transistor TR2. The second NMOS transistor TR2 may be connected between a first pass voltage Vpass1 and the output terminal of the selective SI controller 10, and may be controlled by the second high-voltage switch HVS2.

The third high-voltage switch HVS3 may receive the high voltage VppH and a second pass-voltage enabling signal Vpass2_en, and may be connected to a gate node of the third NMOS transistor TR3. The third NMOS transistor TR3 may be connected between a second pass voltage Vpass2 and the output terminal of the selective SI controller 10, and may be controlled by the third high-voltage switch HVS3.

The fourth high-voltage switch HVS4 may receive the high voltage VppH and a third pass-voltage enabling signal Vpass3_en, and may be connected to a gate node of the fourth NMOS transistor TR4. The fourth NMOS transistor TR4 may be connected between a third pass voltage Vpass3 and the output terminal of the selective SI controller 10, and may be controlled by the fourth high-voltage switch HVS4.

The fifth high-voltage switch HVS5 may receive the high voltage VppH and a first local-voltage enabling signal Vlocal1_en, and my be connected to a gate node of the fifth NMOS transistor TR5. The fifth NMOS transistor TR5 may be connected between the first local-voltage Vlocal1 and the output terminal of the selective SI controller 10, and may be controlled by the fifth high-voltage switch HVS5.

The sixth high-voltage switch HVS6 may receive the high voltage VppH and a second local-voltage enabling signal Vlocal2_en, and may be connected to a gate node of the sixth NMOS transistor TR6. The sixth NMOS transistor TR6 may be connected between the second local-voltage Vlocal2 and the output terminal of the selective SI controller 10, and may be controlled by the sixth high-voltage switch HVS6.

The seventh high-voltage switch HVS7 may receive the high voltage VppH and a third local-voltage enabling signal Vloca3_en, and may be connected to a gate node of the seventh NMOS transistor TR7. The seventh NMOS transistor TR7 may be connected between the third local-voltage Vlocal3 and the output terminal of the selective SI controller 10, and may be controlled by the seventh high-voltage switch HVS7.

The selective SI controller 10 according to the example embodiment may provide the SI driver 30 with one of the program voltage Vpgm, the first through third pass voltages Vpass1~Vpass3, and the first through third local voltages Vlocal1~Vlocal3 in response to a result of the determination by the SI selection identifier 40.

The first through third local voltages Vlocal1~Vlocal3 according to the example embodiment may act as pass voltages that are applied to the programmed or non-programmed memory cells, in a selected area, on memory cells to be programmed (hereinafter referred to as 'program memory cells') in order to extend the pass voltage window.

Figure 4:
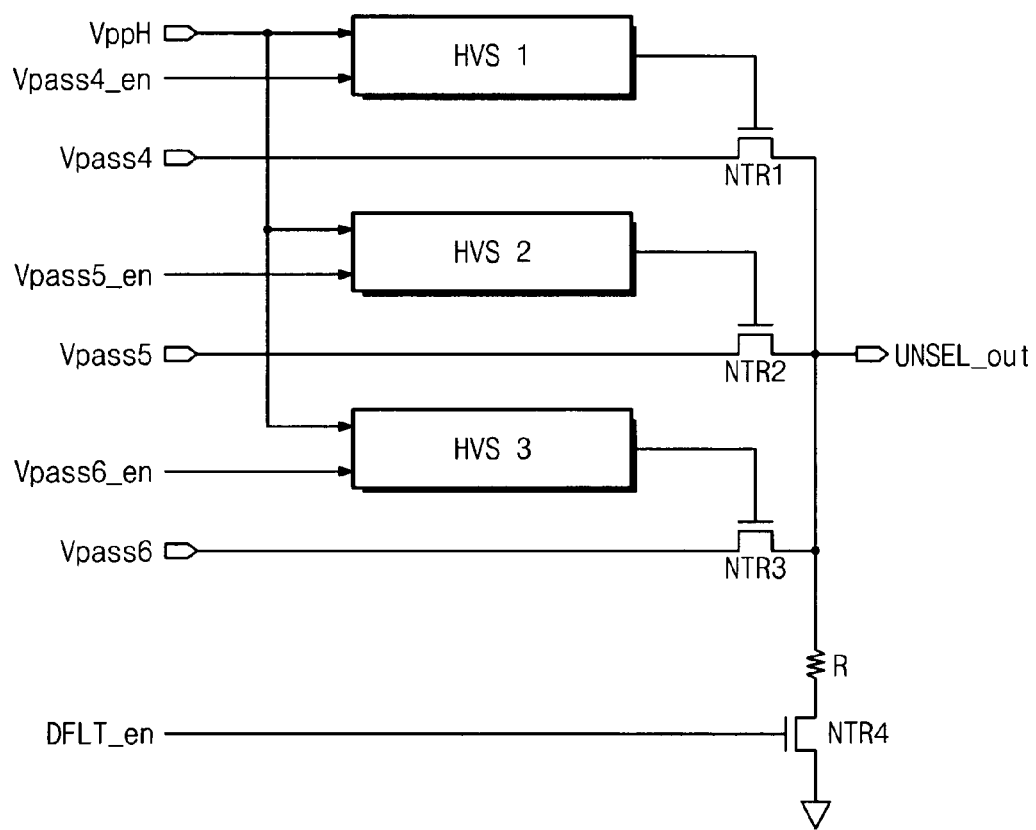

FIG. 4 is a circuit diagram illustrating the deselective SI controller 20 shown in FIG. 2.

Referring to FIG. 4, the example embodiment will be described by assuming that the total number of address bits for the word lines is 32. While FIG. 4 just shows one deselective SI controller 20, the word line driver 60 is needs to have 32 deselective SI controllers 20 in order to supply the 32-bit address.

The deselective SI controller 20 according to the example embodiment includes first through third high-voltage switches HVS1~HVS3, first through fourth NMOS transistors NTR1~NTR4, and a resistor R. Drain nodes of the first through fourth NMOS transistors NTR1~NTR4 are commonly connected to an output terminal of the deselective SI controller 20 from which a deselection signal UNSEL_out is output.

The first high-voltage switch HVS1 may receive the high voltage VppH and a fourth pass-voltage enabling signal Vpass4_en, and may be connected to a gate node of the first NMOS transistor NTR1. The first NMOS transistor NTR1 may be connected between the fourth pass voltage Vpass4 and the output terminal of the deselective SI controller 20, and may be controlled by the first high-voltage switch HVS1.

The second high-voltage switch HVS2 may receive the high voltage VppH and a fifth pass-voltage enabling signal Vpass5_en, and may be connected to a gate node of the second NMOS transistor NTR2. The second NMOS transistor NTR2 may be connected between a fifth pass voltage Vpass5 and the output terminal of the deselective SI controller 20, and may be controlled by the second high-voltage switch HVS2.

The third high-voltage switch HVS3 may receive the high voltage VppH and a sixth pass-voltage enabling signal Vpass6_en, and may be connected to a gate node of the third NMOS transistor NTR3. The third NMOS transistor NTR3 may be connected between a sixth pass voltage Vpass6 and the output terminal of the deselective SI controller 20, and may be controlled by the third high-voltage switch HVS3.

The resistor R may be connected between the output terminal of the deselective SI controller 20 and a source node of the fourth NMOS transistor NTR4. The fourth NMOS transistor NTR4 may be connected between the resistor R and the ground voltage VSS, and may be controlled by a default enabling signal DFLT_en.

The deselective SI controller 20 according to the example embodiment provides the SI driver 30 with one of the fourth through sixth pass voltages Vpass4~Vpass6 in response to a result of the determination by the SI selection identifier 40.

Figure 5:
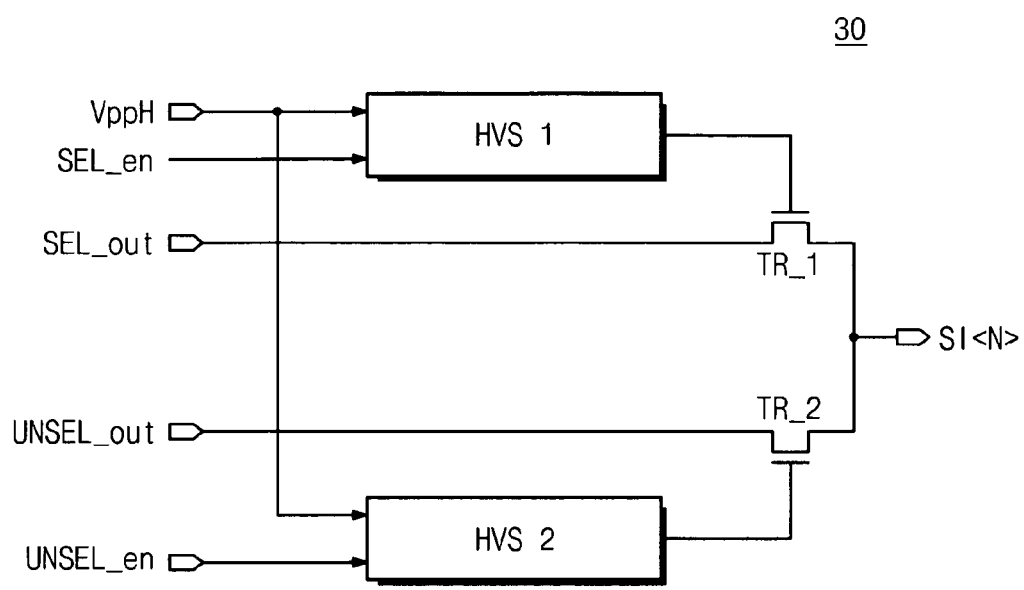

FIG. 5 is a circuit diagram illustrating the SI driver 30 shown in FIG. 2.

Referring to FIG. 5, the example embodiment will be described by assuming that the total number of address bits for the word lines is 32. While FIG. 5 just shows one SI driver 30, the word line driver 60 needs to have 32 SI drivers 30 in order to supply the 32-bit address.

The SI driver 30 according to the example embodiment includes first and second high-voltage switches HVS1 and HVS2, and first and second NMOS transistors TR1_1~TR_2. Drain nodes of the first and second NMOS transistors TR_1 and TR_2 are commonly connected to an output terminal of the SI driver 30 from which a drive signal SI<N> is output.

The first high-voltage switch HVS1 may receive the high voltage VppH and a selection enabling signal SEL_en from the SI selection identifier 40, and may be connected to a gate node of the first NMOS transistor TR_1. The first NMOS transistor TR_1 may be connected between the output SEL_out of the selective SI controller 10 and an output terminal of the SI driver 30, and may be controlled by the first high-voltage switch HVS1.

The second high-voltage switch HVS2 may receive the high voltage VppH and a deselection enabling signal UNSEL_en from the SI selection identifier 40, and may be connected to a gate node of the second NMOS transistor TR_2. The second NMOS transistor TR_2 may be connected between the output UNSEL_out of the deselective SI controller 20 and an output terminal of the SI driver 30, and may be controlled by the first high-voltage switch HVS1.

Figure 6:
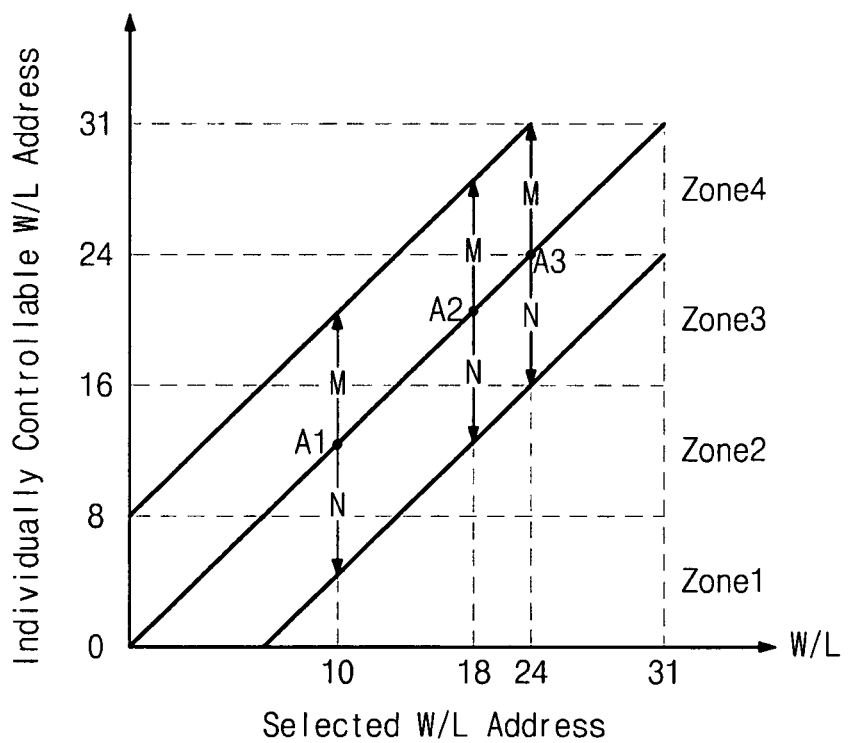

FIG. 6 is a graphic diagram showing an example embodiment. It is assumed that an address for the word lines is formed of 32 bits from 0 (e.g., the first bit) to 31 (e.g., the 32nd bit). On the graph shown in FIG. 6, the X axis denotes the selected word-line address and the Y axis denotes the individually controllable word-line address.

$$A-N<S<A+M (M,N: \text{constant}, S\geq 0) \quad \text{[Equation 1]}$$

Referring to Equation 1, a selected area S may range from a difference between an address A and a constant N, to a sum of the address A and a constant M.

The total word-line address TA according to the example embodiment may be divided into four zones Zone1~Zone4. In other words, as summarized by Equation 2, the total word-line address TA may be quadrisected to be composed of the four zones.

$$0 \leq Zone1 < TA/4$$

$$TA/4 < Zone2 \leq TA/2$$

$$TA/2 < Zone3 \leq 3TA/4$$

$$3TA/4 < Zone4 \leq TA \quad \text{[Equation 2]}$$

The first zone, Zone1, may range from 0 to 7 (e.g., the 1st through 8th address bits) in the selected word-line address. The second zone, Zone2, may range from 8 to 15 (e.g., the 9th through 16th address bits) in the selected word-line address. The third zone, Zone3, may range the range from 16 to 23 (e.g., the 17th through 24th address bits) in the selected word-line address. The fourth zone, Zone4, may range the range from 24 to 31 (i.e., the 25th through 32nd address bits) in the selected word-line address.

Figure 7:
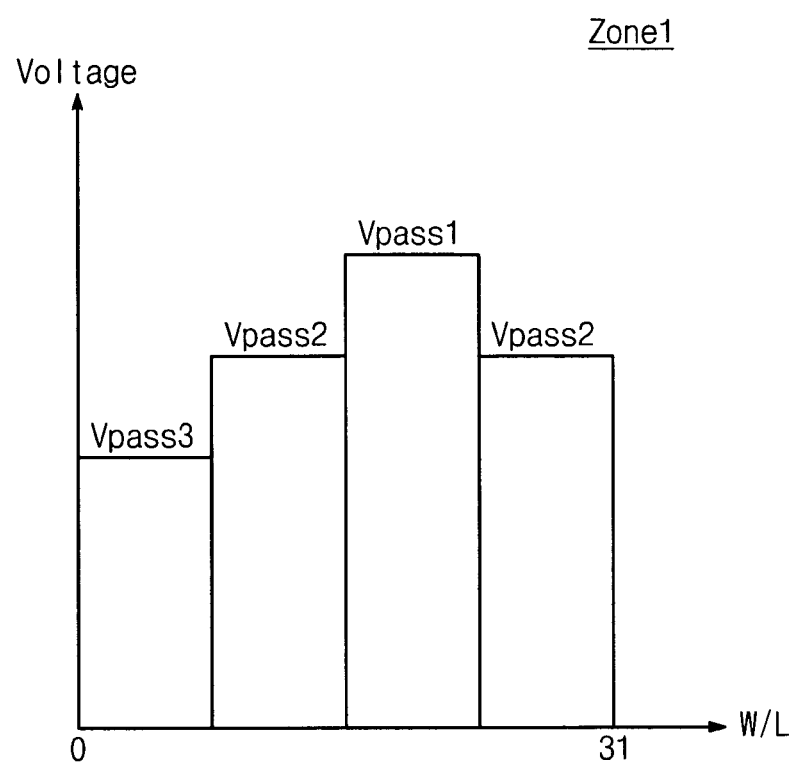
Figure 8:
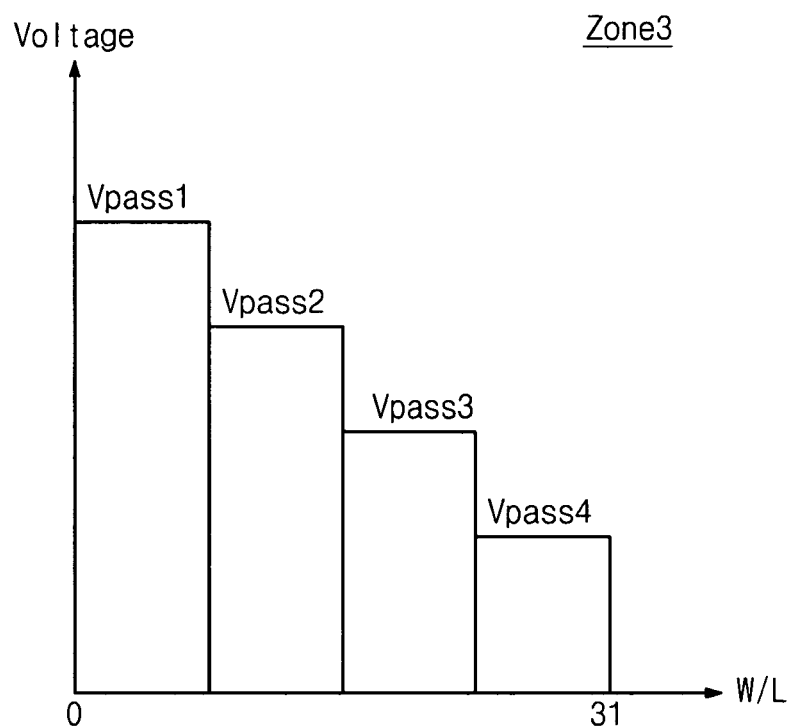

According to the example embodiments, the total word-line address may be segmented into the four zones and the pass voltages applied to the four zones are set differently or individually. For example, the first and third zones, Zone1 and Zone3, may be configured as shown in FIGS. 7 and 8. For example, levels of the plural pass voltages may be allocated to the first and third zones, Zone1 and Zone3, as depicted in FIGS. 7 and 8.

If the total word-line address is formed of 32 bits and a selected word-line address is 15 (e.g., the 16th address bit), the selected word-line address, 14, determined by Equations 1 and 2 may be included in the second zone, Zone2. Assuming the constants M and N are all 5, the selected area S matches the word line address from 10 to 20.

FIG. 7 is a graphic diagram depicting the pass voltages, Vpass1-Vpass3 according to the first zone, Zone1, shown in FIG. 6. FIG. 8 is a graphic diagram depicting the pass voltages according to the third zone, Zone3, shown in FIG. 6.

In the graphs of FIGS. 7 and 8, the X axis denotes the word line address and the Y axis denotes the pass voltage level.

If a selected word-line address is included in the first zone, Zone1, the pass voltages may be applied to unselected word lines as shown in FIG. 7. If a selected word-line address is included in the third zone, Zone3, the pass voltages may be applied to unselected word lines as shown in FIG. 8.

The selected area S according to an example embodiment corresponds to pluralities of the zones in accordance with the highest address A+M and the lowest address A−N. Thus, the selected area S is supplied with different pass voltages in correspondence with the zones.

Referring to FIGS. 6 through 8, if the lowest address A−N of the selected area S is in the first zone Zone1 (i.e., 0≤A−N≤TA/4): the pass voltages as shown in FIG. 7 may be applied to the address included in the first zone, Zone1; the pass voltages of another pattern (not shown) may be applied to the address included in the second zone, Zone2; and the pass voltages, Vpass1-Vpass4 as shown in FIG. 8 may be applied to the address included in the third zone, Zone3.

If the lowest address A−N of the selected area S is in the second zone, Zone2 (i.e., TA/4≤A−N≤TA/2): the pass voltages of another pattern (not shown) may be applied to the address included in the second zone Zone2; the pass voltages as shown in FIG. 8 may be applied to the address included in the third zone Zone3; and the pass voltages of another pattern (not shown) may be applied to the address included in the fourth zone Zone4.

If the lowest address A−N of the selected area S is in the third zone, Zone3 (e.g., TA/2≤A−N≤3TA/4): the pass voltages as shown in FIG. 8 may be applied to the address included in the third zone, Zone3; and the pass voltages of another pattern (not shown) may be applied to the address included in the fourth zone Zone4.

If the lowest address A−N of the selected area S is in the fourth zone, Zone4 (e.g., 3TA/4≤A−N≤TA), the pass voltages of another pattern (not shown) may be applied to the address included in the fourth zone, Zone4.

For example, referring to FIG. 6, the first address bit A1 is assumed to be 10 (e.g., the 11th address bit), which is included in the second zone, Zone2. If the constants M and N are all 8, the selected area S corresponds with the range from 2 to 18.

In this case, the selected area corresponding to the first zone, Zone1, from 2 to 7 may be supplied with the pass voltages by the first zone, Zone1, as shown in FIG. 7. The selected area corresponding to the second zone, Zone2, from 8 to 15 may be supplied with the pass voltages by the second zone, Zone2. And, the selected area corresponding to the third zone, Zone3, from 16 to 18 may be supplied with the pass voltages by the third zone, Zone3, as shown in FIG. 8.

The second address bit A2 is 18 (e.g., the 19th address bit), which is included in the third zone, Zone3. If the constants M and N are all 8, the selected area S corresponds with the range from 10 to 26. In this case, the selected area corresponding to the second zone, Zone2, from 10 to 15 may be supplied with the pass voltages by the second zone, Zone2. The selected area corresponding to the third zone, Zone3, from 16 to 23 may be supplied with the pass voltages by the second zone, Zone3, as shown in FIG. 8. And, the selected area corresponding to the fourth zone Zone4 from 24 to 26 may be supplied with the pass voltages by the fourth zone Zone4.

The third address bit A3 is 24 (e.g., the 25th address bit), which is included in the third zone, Zone3. If the constants M and N are all 8, the selected area S corresponds with the range from 10 to 26. In this case, the selected area corresponding to the second zone, Zone2, from 16 to 23 may be supplied with the pass voltages by the third zone, Zone3, as shown in FIG. 8. The selected area corresponding to the fourth zone, Zone4, from 24 to 31 may be supplied with the pass voltages by the fourth zone Zone4.

Figure 9:
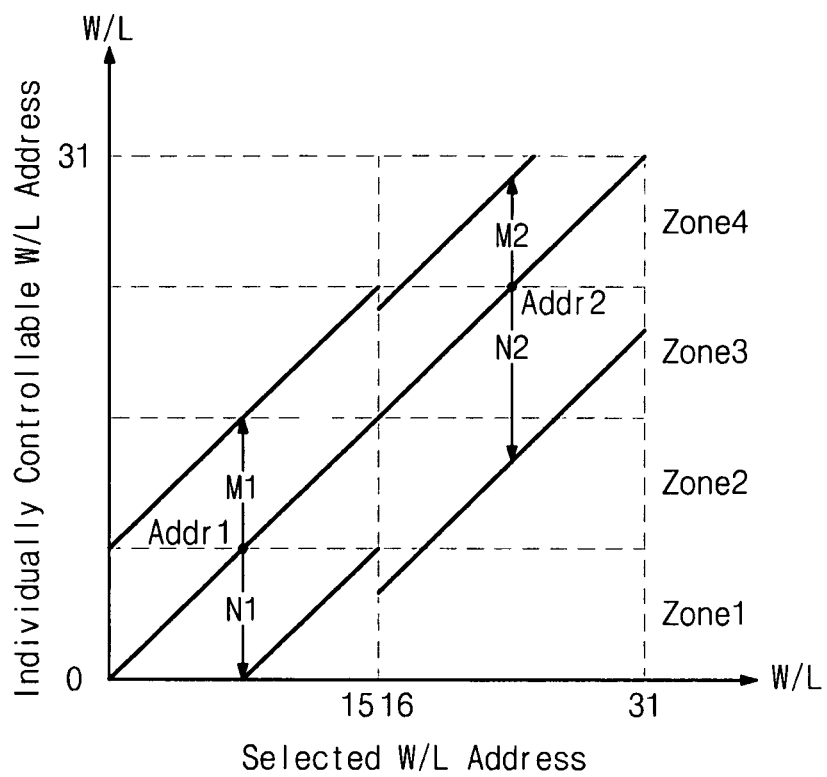

FIG. 9 is a graphic diagram shows an example embodiment. A range of the selected area S may be varied by the word line address. In other words, the selected area S may be assigned to the higher and lower address bits according to the word line address.

Referring to FIG. 9, if the word line address is between 0 and 15, the selected area may correspond with the scope from the higher address bit M1 to the lower address bit N1. Otherwise, if the word line address is between 16 and 31, the selected area may correspond with the scope from the higher address bit M2 to the lower address bit N2.

The selected word-line address shown in FIG. 9 is assigned to two selected areas, but setting the selected areas different from each other every the total word-line address is permissible.

Figure 10:
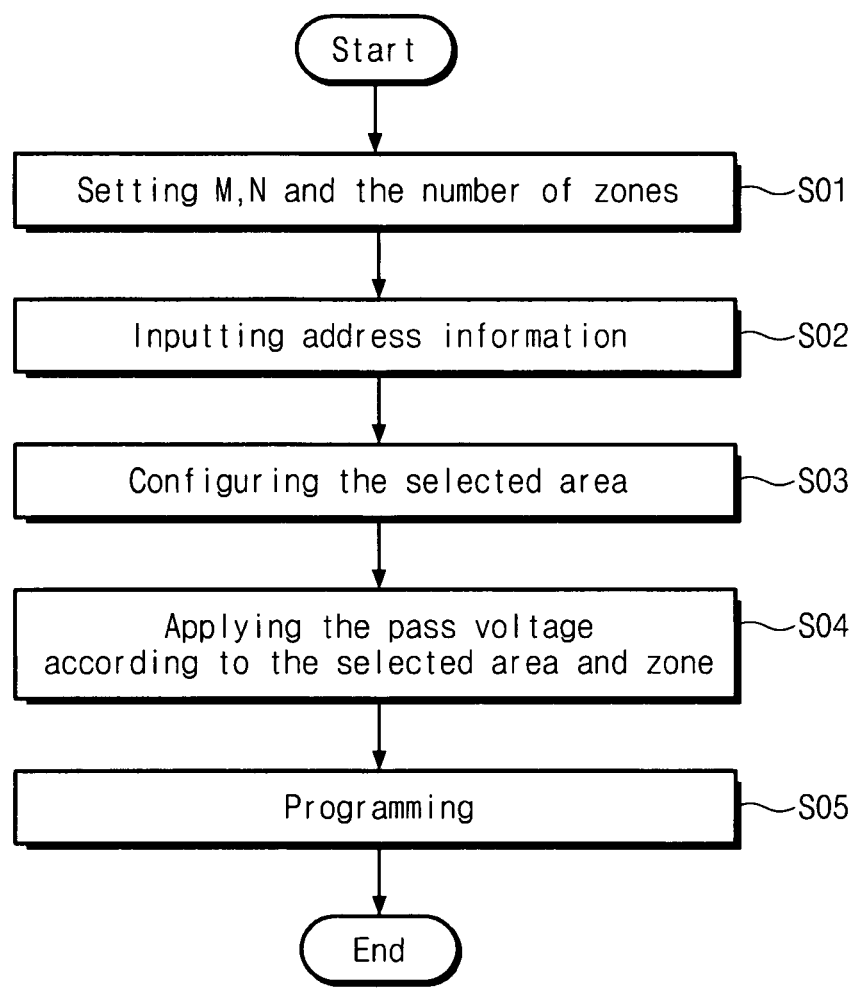

FIG. 10 is a flow chart showing a programming method for the flash memory device according to the example embodiment.

Referring to FIG. 10, the programming method for the nonvolatile memory device according to the example embodiment is carried out by the steps of setting the constants M and N, and the number of zones shown in FIGS. 6 through 8 (S01), inputting address information to be programmed (referred to as 'program address information') (S02), forming the selected area S shown in FIG. 6 with reference to the program address information (S03), applying the pass voltages to all addresses of the selected area by the zones and applying predetermined pass voltages to all addresses of the deselected area (S04), and conducting a programming process (S05).

According to the example embodiment, the programming method for the flash memory may extend the pass voltage window by applying the pass voltages with various voltage levels to the address of the selected area.

Flash memory devices are kinds of nonvolatile memories capable of keeping data stored therein even without power supply. With a rapid increase of using mobile apparatuses such as cellular phones, personal digital assistants (PDA), digital cameras, portable gaming consoles, and MP3, the flash memory devices are widely employed as code storage, as well as data storage. The flash memory devices may be also utilized in home applications such as high-definition televisions, digital versatile disks (DVDs), routers, and global positioning systems (GPSs).

Figure 11:
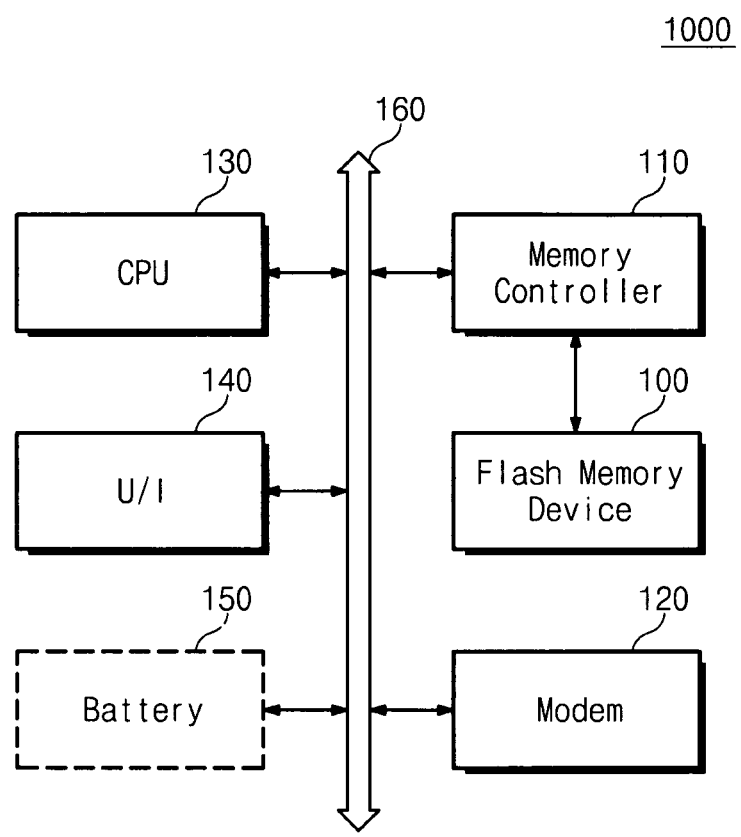

A schematic structure of a computing system including the flash memory device of the present invention is illustrated in FIG. 11. The computing system 1000 according to the example embodiment is organized by including a central processing unit (CPU) 130, a user interface 140, a modem 120 such as a baseband chipset, a memory controller 110, and the flash memory device 100, all of which are connected to each other by way of a bus 160. The memory controller 110 operates to control the flash memory device 100. The flash memory device 100 may be configured substantially as same as that shown in FIG. 1.

In the flash memory device 100, N-bit data (N is a positive integer) processed or to be processed by the CPU 130 may be stored through the memory controller 110. If the computing system 1000 shown in FIG. 11 is a mobile apparatus, a battery 150 for supplying power may be included. Although not shown in FIG. 11, the computing system 1000 may be further equipped with an application chipset, a camera image processor (e.g., complementary metal-oxide-semiconductor (CMOS) image sensor; i.e., CIS), a mobile DRAM, etc. The memory controller 110 and the flash memory device 100, for example, are able to constitute a solid state drive/disk (SSD) using a nonvolatile memory for storing data.

An exemplary SSD is disclosed in U.S. Patent Publication No. 2006-0152981, which is incorporated herein by reference. The memory controller 110 and the flash memory device 100 are also able to form a memory card using a nonvolatile memory for storing data.

Figure 12:
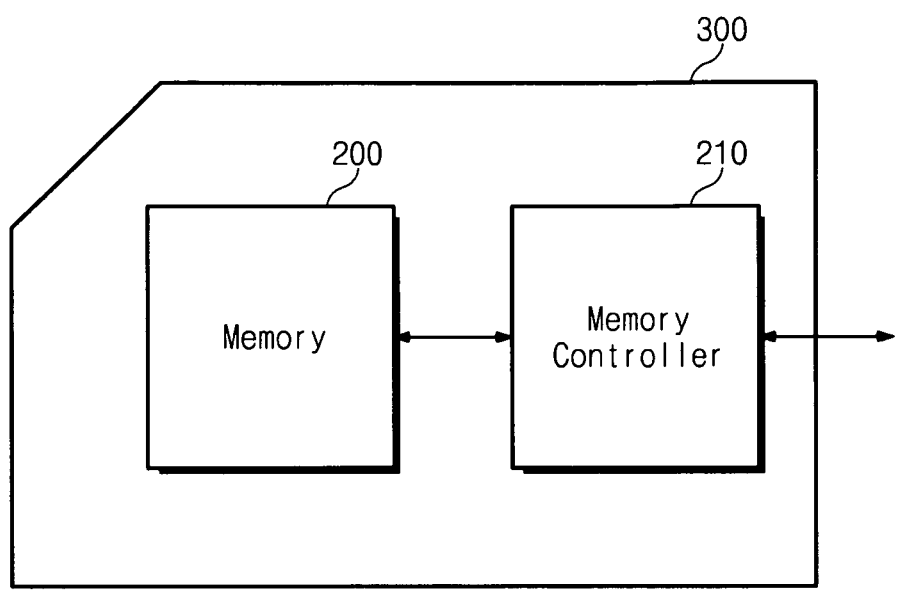

FIG. 12 is a block diagram of a memory-based storage unit according to an example embodiment.

The memory-based storage unit 300 shown in FIG. 12 is implemented in a form of card by including a memory 200 and a memory controller 210. For example, the card 300 may be a card adaptable to an industrial standard for using electronic apparatuses such as digital cameras, personal computers, and so on. In addition, the memory controller 210 is able to control the memory 200 based on control signals received from a system (e.g., an external system) by the card 300.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

While example embodiments have been particularly shown and described, it will be understood by one of ordinary skill in the art that variations in form and detail may be made therein without departing from the spirit and scope of the claims

What is claimed is:

1. A flash memory device, comprising:
   a controller configured to determine,
      a plurality of fixed zones associated with a memory array, each of the plurality of fixed zones having an associated pass voltage, the plurality of fixed zone being equally divided, and each fixed zone including a plurality of word lines;
      higher, M, and lower, N, word-line address bits based on an input word-line address,
      a selected area of the memory array based on the higher and lower word-line address bits, the selected area including one of the plurality of fixed zones, and
      an unselected area of the memory array based on the selected area, the unselected area including one or more of the plurality of fixed zones; and
   a high voltage generator configured to,
      provide a first pass voltage to a word line of the selected area, and
      provide a second pass voltage to a word line of the unselected area, such that the unselected word lines of the fixed zones that correspond to the selected area have the same pass voltage regardless of which one of the plurality word lines is selected.

2. The flash memory device of claim 1, wherein word-line addresses of the memory array are divided into a first set from the plurality of fixed zones.

3. The flash memory device of claim 2, wherein word-line addresses of the selected area are divided into a second set from the plurality of fixed zones.

4. The flash memory device of claim 1, wherein
   the set of pass voltages includes at least one voltage and the set of pass voltages associated with each fixed zone are different, and
   the high voltage generator selects,
      the first pass voltage from the set of voltages associated with the fixed zone corresponding to the selected area, and
      the second pass voltage from the set of voltages associated with the fixed zone corresponding to the unselected area.

5. The flash memory device of claim 4, wherein the high voltage generator selects the first pass voltage based on the word-line address.

6. The flash memory device of claim 1, wherein the higher and lower word-line address bits differ by the input word-line address.

7. The flash memory device of claim 1, wherein the input word-line address is supplied by a program voltage.

8. The flash memory device of claim 1, wherein information about the M and the N is stored in one of an electric fuse and a nonvolatile memory.

9. The flash memory device of claim 8, wherein the memory array is a nonvolatile memory array and includes a NAND flash memory.

10. The flash memory device of claim 1, wherein the M and the N are natural numbers and smaller than a total number of word lines in the memory array.

11. A programming method of a flash memory, comprising:
    setting two constants M and N;
    inputting word-line address information to be programmed;
    determining, a plurality of fixed zones associated with the flash memory, each of the plurality of fixed zones having an associated pass voltage, the plurality of fixed zone being equally divided, and each fixed zone including a plurality of word lines, the word-line address information to be programmed, higher, M, and lower, N, word-line address bits based on the word-line address information, a selected area of the flash memory based on the higher and lower word-line addresses, the selected area including one of the plurality of fixed zones, and an unselected area of the flash memory based on the selected area, the unselected area including one or more of the plurality of fixed zones;

applying a first pass voltage to an address of the selected area; and applying a second pass voltage to an address of the unselected area, such that the unselected word lines of the fixed zones that correspond to the selected area have the same pass voltage regardless of which one of the plurality of word lines is selected.

12. The method of claim 11, wherein the input word-line address is supplied by a program voltage.

13. The method of claim 11, wherein word-line addresses of the flash memory are divided into one or more sets from the plurality of fixed zones.

14. The method of claim 13, wherein the set of pass voltages include at least one voltage and the set of pass voltages associated with each fixed zone are different, the first pass voltage is selected from the set of voltages associated with the fixed zone corresponding to the selected area, and the second pass voltage is selected from the set of voltages associated with the fixed zone corresponding to the unselected area.

15. The method of claim 14, wherein the first pass voltage is selected based on the word-line address information.

16. The method of claim 11, wherein the selected area includes the constants M and N which differ by the input word-line address.

17. The method of claim 11, wherein the constants M and N are natural numbers and smaller than a total number of word lines in the memory array.

18. A data processing system comprising:

a main board;

a central processing unit mounted on the main board;

a memory controller configured to determine, a plurality of fixed zones associated with a memory array, each of the plurality of fixed zones having an associated pass voltage, the plurality of fixed zone being equally divided, and each fixed zone including a plurality of word lines, higher, M, and lower, N, word-line address bits based on an input word-line address, a selected area of the memory array based on the higher and lower word-line address bits, the selected area including one of the plurality of fixed zones, and an unselected area of the memory array based on the selected area, the unselected area including one or more of the plurality of fixed zones;

a high voltage generator configured to, provide a first pass voltage to a word line of the selected area, and provide a second pass voltage to a word line of the unselected area, such that the unselected word lines of the fixed zones that correspond to the selected area have the same pass voltage regardless of which one of the plurality of word lines is selected; and a memory device including the memory array and electrically coupled to the memory controller.

* * * * *